United States Patent [19]

Desyllas et al.

[11] Patent Number: 4,730,317

[45] Date of Patent: Mar. 8, 1988

[54] DIGITAL INTEGRATED CIRCUITS

[75] Inventors: Peter L. L. Desyllas, Wilmslow; Finbar Naven, Cheadle Hulme, both of Great Britain

[73] Assignee: International Computers Limited, London, England

[21] Appl. No.: 882,947

[22] Filed: Jul. 7, 1986

[30] Foreign Application Priority Data

Jul. 25, 1985 [GB] United Kingdom ................. 8518860

[51] Int. Cl.⁴ ............................................. G01R 31/28

[52] U.S. Cl. ........................................ 371/25; 371/15; 324/73 R

[58] Field of Search ................. 371/15, 25; 324/73 R, 324/73 AT

[56] References Cited

U.S. PATENT DOCUMENTS

| | | | |
|---|---|---|---|
| 4,317,200 | 2/1982 | Wakatsuki | 371/25 |
| 4,567,593 | 1/1986 | Bashaw | 371/25 |
| 4,575,674 | 3/1986 | Bass | 371/25 X |
| 4,597,042 | 6/1986 | d'Angeac | 371/25 X |
| 4,635,261 | 1/1987 | Anderson | 371/25 |

*Primary Examiner*—Jerry Smith
*Assistant Examiner*—Robert W. Beausoliel
*Attorney, Agent, or Firm*—Lee, Smith & Zickert

[57] ABSTRACT

A digital integrated circuit is described in which the internal registers are organized into a number of serial shift paths to facilitate testing. Each path has a number of modes; USER, HOLD, SHIFT and SELF-TEST modes. Shifting of a path is achieved by putting the path into HOLD mode and then, at each of a series of transfer pulses (TR), putting the path into shift mode for one clock beat. This allows the shifting to be performed at a lower rate than the internal clock rate of the chip; in particular, it can be performed at a rate compatible with a relatively slow diagnostic processor.

7 Claims, 8 Drawing Figures

DIGITAL INTEGRATED CIRCUITS

This invention relates to digital integrated circuits and is particularly although not exclusively concerned with very large scale integrated (VLSI) circuits containing at least 50,000 logic gates per chip.

In order to facilitate testing, it is known to implement the various data storage circuits on such a chip in the form of shift register latches, connected together in series to form a serial shift path between a pair of external pins on the chip. This allows test data to be shifted serially into the latches, for performing diagnostic tests, and allows test results to be read out serially for analysis. In normal operation, the shifting action of the latches is inhibited, allowing each to perform its intended function as part of the data-flow within the chip.

The diagnostic tests may be controlled by a diagnostic processor which generates the test data and analyses the test results. This processor may be a relatively small processor with a relatively slow operating speed e.g. a microprocessor. This can lead to problems: the diagnostic processor may not be able to generate test data sufficiently quickly for shifting into the serial shift path, and may not be able to handle the test results quickly enough.

The object of the present invention is to avoid these problems.

SUMMARY OF THE INVENTION

According to the invention there is provided a digital integrated circuit comprising at least one group of latches operable in the following modes:

(a) a user mode in which the group acts as at least one register with parallel inputs and outputs, (b) a hold mode in which the contents of all the latches in the group are preserved, and (c) a shift mode in which the latches are coupled together to form a serial shift path extending between a serial input terminal and a serial output terminal, data being stepped through this path by means of a clock signal, the circuit having a control circuit operable to put the (or each) group into its hold mode and then, in response to each of a series of transfer pulses, to put the group (or a selected one of the groups) into the shift mode for one clock beat.

It can be seen that the invention allows the shifting of data to be controlled by the transfer pulses, rather than by the clock pulses. These transfer pulses can be produced at any desired rate equal to or lower than the clock frequency. Hence, data can be shifted through the serial shift path at a rate compatible with a relatively slow diagnostic processor.

One embodiment of the invention will now be described by way of example with reference to the accompanying drawings.

DESCRIPTION OF AN EMBODIMENT OF THE INVENTION

Figure 1:
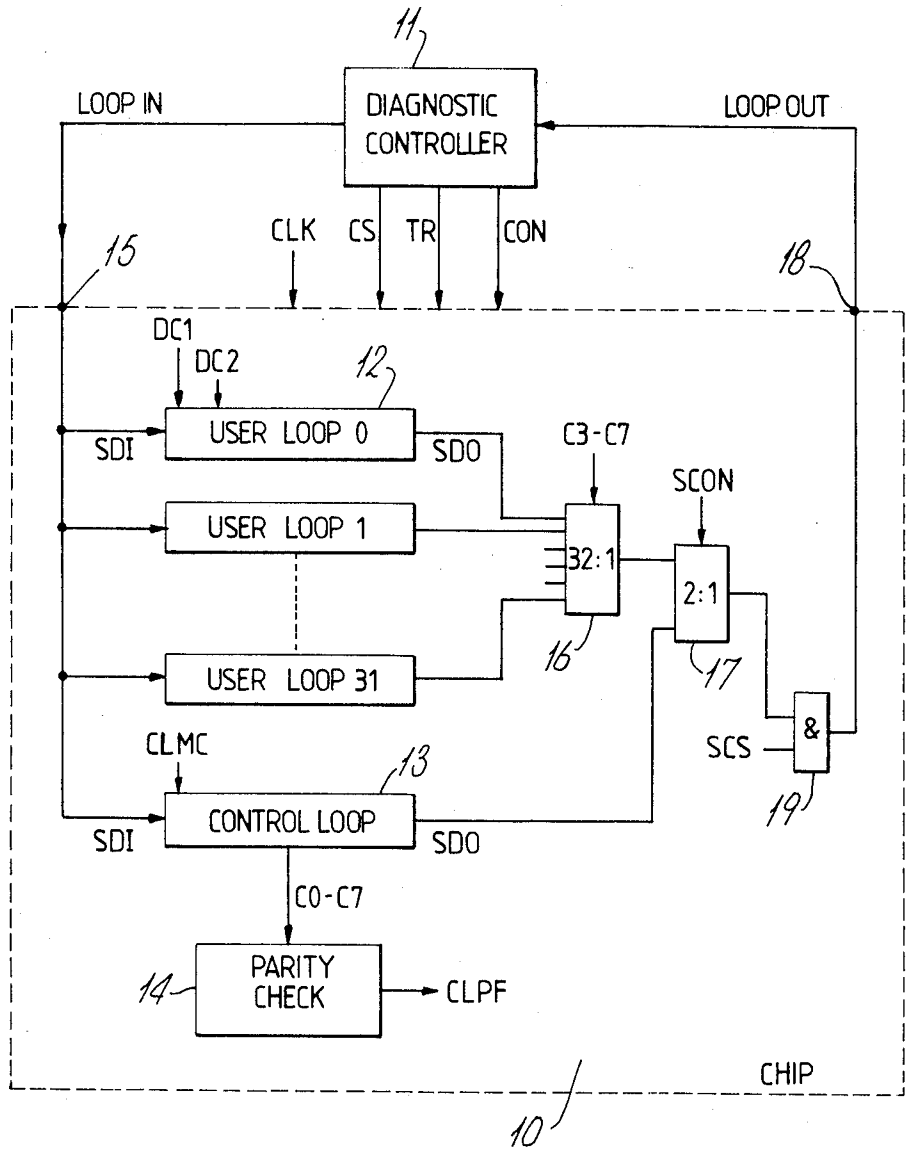
FIG. 1 is a block diagram of a VLSI chip.

Referring to FIG. 1, this shows a VLSI chip 10, which is connected together with other similar chips (not shown) to form a data processing unit. The unit also includes a diagnostic controller 11 which may be a conventional microcomputer, programmed to perform diagnostic tests on the chips. All the chips 10 receive a clock signal CLK which controls their operations. The diagnostic controller 11, on the other hand, operates at a slower speed, controlled by its own internal clock.

Each chip 10 contains functional logic circuits for providing the required data processing functions. These logic circuits include data storage circuits, comprising a large number of data bit cells, and combinational logic circuits. The exact nature of these logic circuits forms no part of the present invention and so will not be described herein. For example, the combinational logic circuits may include an arithmetic and logic unit, and the data storage circuits may comprise input and output registers for that unit.

For diagnostic purposes, the bit cells are organised into a plurality of groups, referred to herein as user loops 12. The chip shown contains 32 such loops (user loops 0-31). For example, each of these loops may contain up to 128 bit cells, grouped together to form one or more logical registers.

Each user loop has four basic modes of operation, controlled by signals DC1, DC2 as follows:

| DCl | DC2 | Mode |
|---|---|---|
| 0 | 0 | TEST |
| 0 | 1 | SHIFT |
| 1 | 0 | USER |
| 1 | 1 | HOLD |

These modes will be described in detail later. For the moment, it should be noted that in the shift mode the bit cells of the loop are all linked together to form a serial shift path between a serial data input SDI and a serial data output SDO.

The chip also includes a register 13 referred to as the control loop. This is used, as will be described, for entering control functions into the chip. The control loop 13 is controlled by a signal CLMC: when CLMC is true, the control loop acts as a shift register allowing data to be shifted serially between an input SDI and an output SDO; when CLMC is false, the shifting action is suppressed and the contol loop acts as a parallel input/output register. The control loop contains eight bits C0-C7 of which C0 acts as a parity bit. The contents of the control loop are checked by a circuit 14 to produce a signal CLPF whenever correct parity is not detected.

The serial data inputs SDI of the control loop 13 and user loops 12 are all connected to a common external pin 15 on the chip. A loop input line LOOPIN from the controller 11 is connected in parallel to the pins 15 on all the chips.

The serial data outputs SDO of the user loops 12 are connected to respective inputs of a 32:1 multiplexer 16, controlled by a loop number code provided by bits C3-C7 of the control loop. The output of multiplexer 16 is fed to one input of a 2:1 multiplexer 17, the other input of which is connected to the serial data output SDO of the control loop 13. The output of the multiplexer 17 is connected to an external pin 18 on the chip by way of an AND gate 19. The pins on all the chips are connected together in a wired -OR configuration, to a loop output line LOOPOUT which is returned to the diagnostic controller 11.

The diagnostic controller 11 produces the following control signals for the chips:

CS (chip select). This is an individual control signal for each chip and is used by the diagnostic controller to select one or more chips.

CON (control). This is common to all the chips, and is used to select the control loop within the selected chip or chips.

TR (transfer). This is common to all the chips, and provides a diagnostic clock signal for shifting the control loop and user loops.

Figure 2:
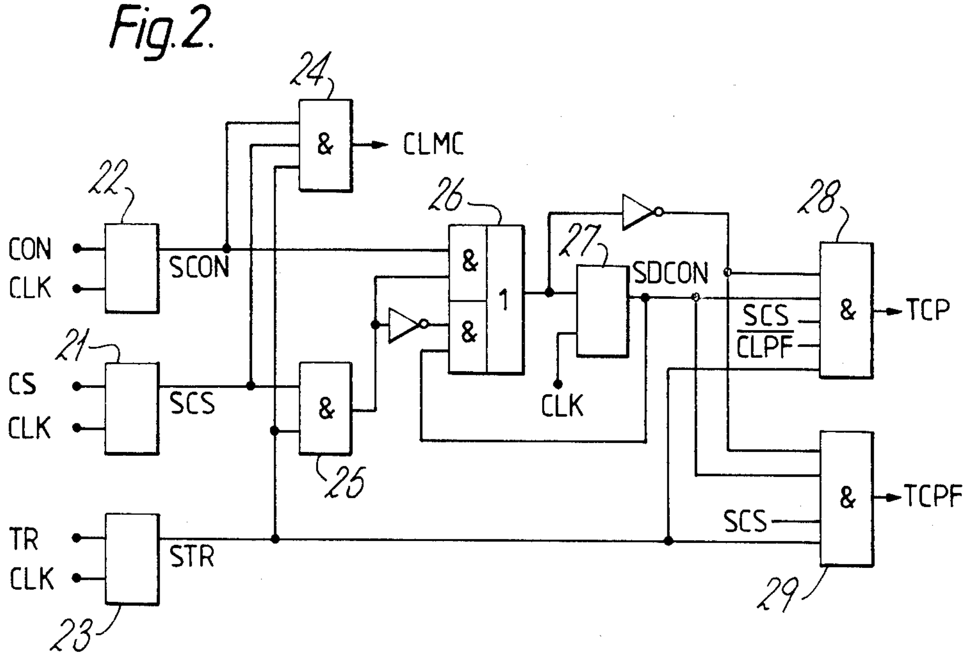
FIGS. 2-8 are logic diagrams showing various parts of the VLSI chip in detail.

Referring now to FIG. 2, the three control signals CS, CON, and TR are gated into respective bistable latches (flip-flops) 21,22,23 in the chip by the clock signal CLK. This staticises the signals for one clock beat before they are used. The staticised signals are referred to as SCS, SCON and STR.

The TR signal is a pulsed signal, and is synchronised with the clock CLK by means of logic (not shown) external to the chips, so that it can change state only between successive clock pulses. The signals CS and CON on the other hand are asynchronous with respect to the clock CLK. The only requirement is that they must remain steady while STR is active, i.e. they may change level only if STR is false.

The signals SCS,SCON and STR are combined in an AND gate 24 to produce the signal CLMC which controls the mode of operation of the control loop. The control loop is therefore enabled for shifting at each TR pulse provided SCS and SCON are both true, i.e. provided the chip is selected and the control loop is selected.

The diagnostic controller 11 can load a control function into the control loop of any of the chips by means of the following sequence:

(1) Select the required chip by applying a CS signal to it.

(2) Select the control loop by raising the CON signal.

(3) Produce a string of eight TR pulses, so as to shift eight bits into the selected control loop from the loop input line LOOPIN.

The TR pulses need not be produced at consecutive beats of the clock CLK; in general they will be produced at a somewhat slower speed, compatible with the slower operating speed of the diagnostic controller.

The signals SCS and STR are combined in an AND gate 25, the output of which controls a 2-way selection circuit 26. The output of this circuit is fed to the input of a latch 27. When the AND gate 25 is enabled (SCS and STR both true) the circuit 26 selects the signal SCON, allowing it to be clocked into the latch 27 at the next beat of clock CLK. When AND gate 25 is disabled, the circuit 26 selects the output SDCON of the latch 27, causing the current contents of the latch to be fed back to its input, thereby preserving its existing state.

It can be seen that, if both STR and SCS are true, then SDCON represents a version of SCON, delayed by one clock beat.

An AND gate 28 combines the inverse of the output of circuit 26, SDCON, SCS, the inverse of CLPF, and STR, to produce a transfer control pulse TCP. It can be seen that TCP is generated at the first TR pulse following removal of SCON, provided SCS is still true, and provided there is no parity failure in the control loop.

Another AND gate 29 produces a signal TCPF, similar to TCP except that it is not inhibited by the control loop parity failure signal CLPF.

As will be described in more detail later, the transfer control pulse TCP activates the control function which has been loaded into the control loop. The control loop is first loaded with the control function as described above. The CON signal is then removed, and one further TR pulse is produced. Provided SCS is still true, this causes TCP to be generated, so as to activare the control function. If CS is removed before arrival of the further TR pulse, TCP is not generated and the function is not activated. The function can be activated later by restoring CS to the chip and then applying another TR pulse. This allows different control functions to be shifted into different chips, one at a time, and then to be activated simultaneously.

Referring again to FIG. 1, the signal SCON is also used to control the 2:1 multiplexer 17 so as to select the control loop 13 when SCON is true. The signal SCS is also used as an enabling signal for the output AND gate 19 so as to ensure that data can be output from the pin 18 only if the chip is selected.

Figure 3:
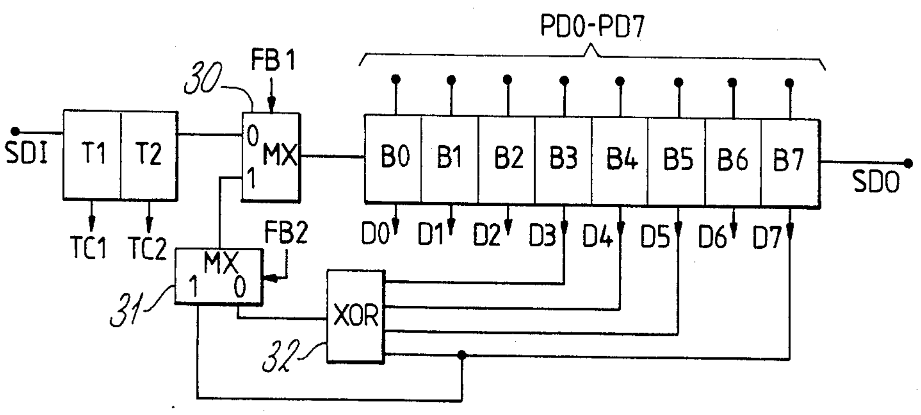

Referring to FIG. 3, this shows one of the user loops 12 in more detail.

The loop includes a plurality of data bit cells B0–B7 with respective parallel data inputs PD0–PD7 and outputs D0–D7. These inputs and outputs are connected to other functional circuits on the chip according to their intended function in normal operation of the chip. While the loop shown in this Figure contains eight bit cells it will be appreciated that different loops may contain different numbers of cells.

Each loop also contains two test bit cells T1,T2 which produce test control signals TC1,TC2 for controlling the operation of the loop in the test mode, as will be described. The data bit cells B0–B7 and the test bit cells T1,T2 are connected together in series between the serial data input SDI and serial data output SDO, by way of a multiplexer 30. The multiplexer is controlled by a signal FB1: when FB1 is false, it selects the output of T2, and when FB1 is true, it selects the output of another multiplexer 31. The multiplexer 31 is controlled by a signal FB2: when FB2 is true, it selects the output of the last data bit cell B7, and when FB2 is false it selects the output of an exclusive -OR circuit 32. The exclusive -OR circuit combines the outputs of selected data bit cells in the loop: in this case, the outputs of cells B3,B4,B5 and B7.

Figure 4:
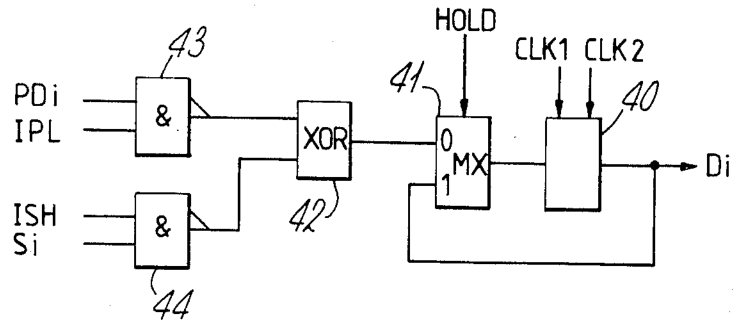

Referring now to FIG. 4, this shows one of the bit cells Bi (where i=0,1 . . . 7) in detail.

The cell includes a dynamic master-slave type latch 40, clocked by a two phase clock signal CLK0,CLK1 derived from the clock signal CLK. The output of the latch represents the data output Di of the cell. The input of the latch comes from a 2-way multiplexer 41, controlled by a signal HOLD. When HOLD is true, the multiplexer selects the output of the latch, thereby causing the current contents of the latch to be clocked back into it at the next clock pulse: this effectively freezes the contents of the latch in their existing state. When HOLD is false, the multiplexer selects the output of an exclusive -OR gate 42.

The exclusive -OR gate 42 has two inputs connected to the output of NAND gates 43,44. Gate 43 receives the parallel data input bit PCi of the cell, and a control signal IPL. Gate 44 receives a serial data input signal Si and a control signal ISH. The serial input Si comes from the data output Di-1 of the preceding bit cell or, in the case of B0, from the multiplexer 30 (FIG. 3).

The test control bit cells T1,T2 are similar, except that they receive a control signal TCHOLD instead of HOLD, and the gates 42,43,44 are omitted: the input to the multiplexer 41 comes directly from the serial input terminal.

Figure 5:
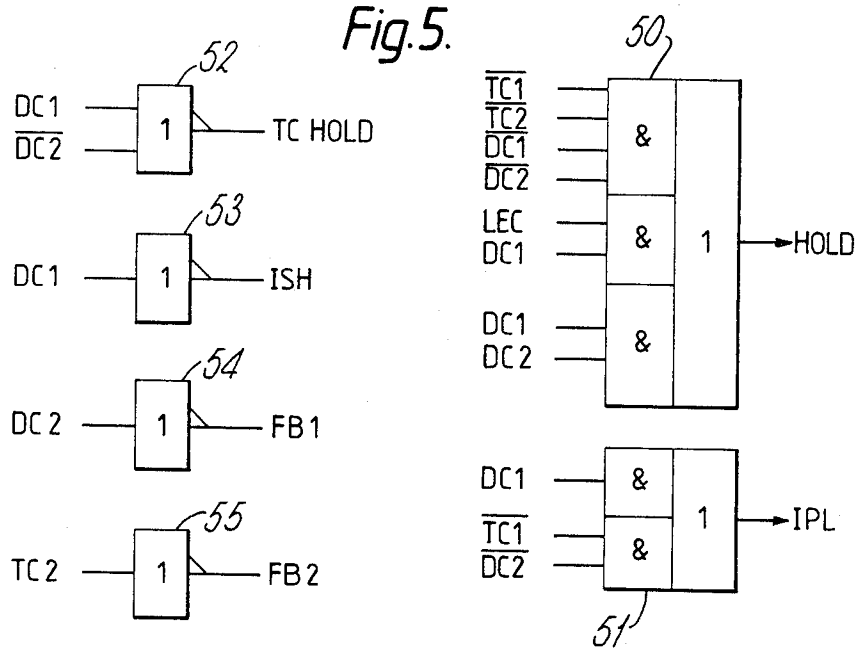

Referring now to FIG. 5, this shows a control circuit for one of the user loops; each user loop has a similar circuit. The control circuit consists of gates 50–55 which respectively produce the control signals HOLD, IPL, TCHOLD, ISH, FB1 and FB2 for associated loop as shown. As described above, each user loop has four basic modes of operation, according to the values of the control signals DC1,DC2 for that loop. The operation of the loop in each of the four modes is as follows.

HOLD mode (DC1=DC2=1). The gate 50 is enabled, providing the HOLD signal. This switches the multiplexer 41 in each data bit cell of the loop so that it selects the output of the latch 40. Thus, the contents of all the bit cells are frozen in their existing states. Similarly, the gate 52 is enabled, producing TCHOLD, which freezes the test control bit cells T1,T2.

USER mode (DC1=1, DC2=0). In this mode, the gate 51 is enabled, producing IPL. This enables the NAND gate 43 in each data bit cell, allowing the parallel data bits PD0-7 to be loaded into the latches at the next clock beat. However, if a load enable control signal LEC is also present, the gate 50 is enabled, and HOLD is produced, freezing the contents of the latches and preventing the loading of the data. The USER mode is the normal operating mode for the user loop, when it is serving its intended function as part of the data processing circuits on the chip.

SHIFT mode (DC1=0,DC2=1). In this mode the gate 53 is enabled, providing ISH. This enables the NAND gate 44 in each data bit cell, allowing data to be shifted between adjacent cells. Also, the TCHOLD signal is removed, allowing data to be shifted between the test control bit cells. Thus, in this mode, the test control and data bit cells are all linked together to form a serial shift path between the serial data input SDI and the serial data output SDO. Data is shifted one step along this path at each clock beat.

TEST mode (DC1=DC2=0). In this mode, gate 53 is enabled, producing ISH, which enables shifting between the data bit cells. Gate 52 is also enabled, producing TCHOLD, so that the test control bit cells are held in their existing states. In this mode, one of four sub-modes is selected according to the values of the test control bits TC1,TC2, as follows:

| TC1 | TC2 | Sub-mode |
|---|---|---|
| 0 | 0 | TEST HOLD |
| 0 | 1 | TEST ANALYSE |
| 1 | 0 | TEST SLIDE |
| 1 | 1 | TEST GENERATE |

In the test slide sub-mode, the signals FB1 and FB2 are both true, which switches the multiplexers 30,31 so as to feed back the output of the last bit cell B7 to the serial data input SO of the first bit cell B0 of the loop. Thus, in this case, the user loop acts as a circular shift register. This can be used to produce sliding test patterns for which the loop is connected.

In the test generate sub-mode, FB1 is true and FB2 is false. This switches the multiplexers 30,31 so as to feed back the output of the exclusive -OR gate 32 to the serial input SO of the first bit cell B0. Thus, in this case the user loop acts as a linear feedback shift register. This can be used to produce sequences of pseudo-random numbers for testing the other circuits on the chip.

In the test analyse sub-mode, FB1 and FB2 have the same values as in the test generate case, and so the loop again acts as a linear feedback shift register. However, in this case, both IPL and ISH are true, so that both NAND gates 43 and 44 are enabled in each bit cell. Hence, in this case, at each clock beat, the parallel data bits PD0-7 are combined with the shifting data in the exclusive -OR gates 42, and loaded into the latches 40. The user loop therefore acts as a digital signature analyser, for combining a sequence of parallel input words to form a number characteristic of that sequence. This can be used for testing the logic circuits which supply the parallel data PD0-7.

In the test hold sub-mode, the gate 50 is enabled, producing HOLD, so that all the data bit cells are held in their existing states.

Figure 6:
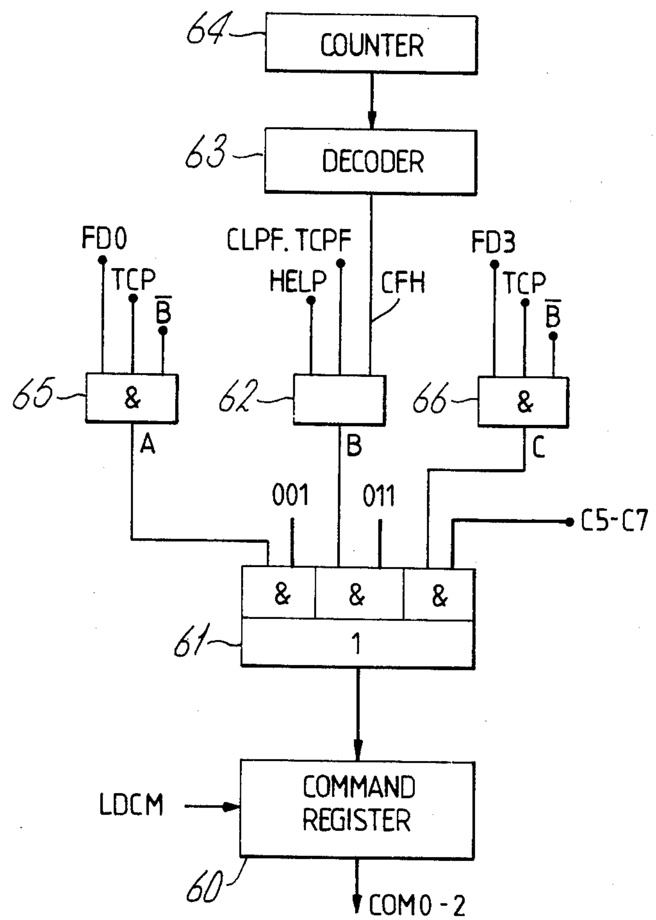

Referring now to FIG. 6, the operational state of the chip is controlled by a command register 60 on the chip. This register holds a three-bit command COM 0-2 which defines one of six control states as follows:

| COM 0-2 | State |
|---|---|
| 000 | SELF TEST |
| 001 | SHIFT |
| 010 | RUN |
| 011 | HOLD |
| 101 | RESET |
| 110 | RUN N BEATS |

Commands are loaded into the register 60 from a selector circuit 61 which selects one of three inputs according to which of three control signals A, B and C is true. Signal A causes the register 60 to be loaded with a hard-wired pattern 001 representing the SHIFT command. Signal B causes the register 60 to be loaded with a hard-wired 011 representing the HOLD command. Signal C causes the register 60 to be loaded with a command specified by bits C5–C7 of the control loop 13. Loading of the command register is enabled by a control signal LDCM which is the OR-function of A, B and C.

The control signal B is produced by an OR gate 62 which receives the following inputs:

CLPF.TCPF: this is the AND function of CLPF, which indicates the presence of a parity failure in the control loop, and TCPF (i.e. the version of TCP which is not inhibited by CLPF).

HELP: this indicates the presence of a parity failure elsewhere on the chip.

CFH: this is produced by a decoder 63 when it detects that a counter 64 has counted down to zero.

Thus, it can be seen that if there is a parity failure in the control loop or elsewhere on the chip the signal B is produced, and causes the command register to be loaded with the HOLD command.

The control signals A and C are produced by AND gates 65,66 which receive function control signals FD0 and FD3 respectively. Both of these AND gates are controlled by the transfer control pulse TCP, and both are inhibited if B is true. Thus, it can be seen that the control signal B has priority over the signals A and C, which means that the corresponding input is selected in preference to the other two.

Figure 7:
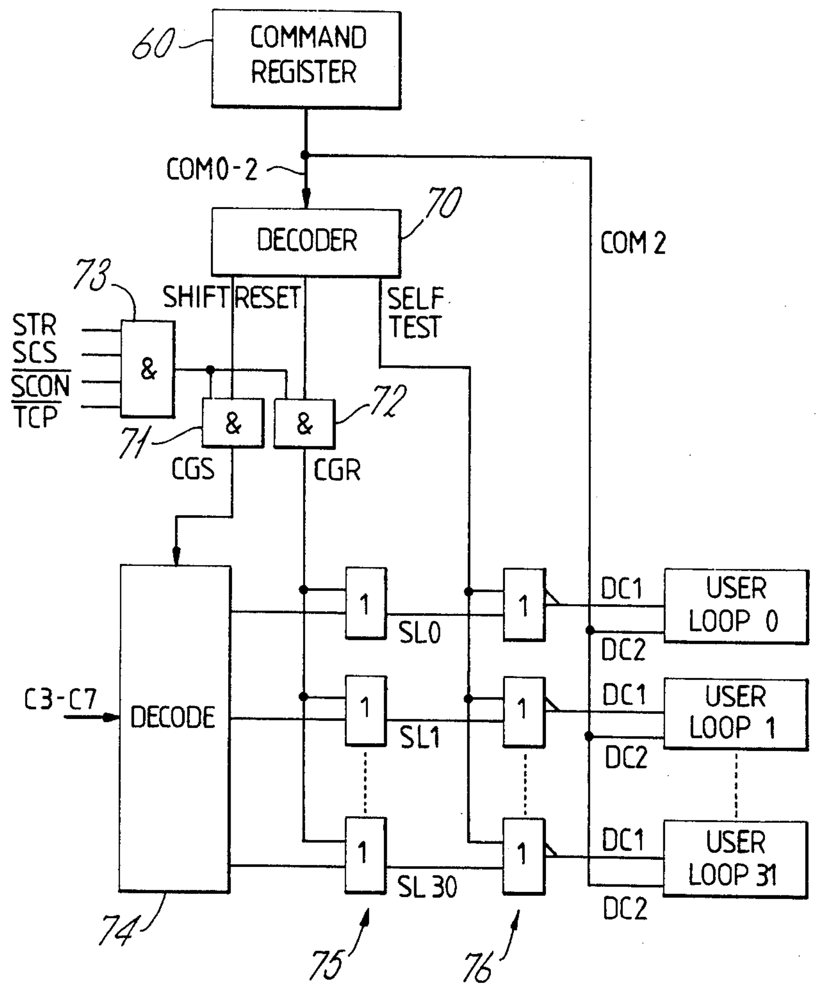

Referring now to FIG. 7, the contents COM 0-2 of the command register 60 are decoded in a decoder 70 to produce signals SHIFT, RESET and SELF TEST whenever the corresponding commands are present.

The SHIFT and RESET signals are fed to respective AND gates 71,72. These gates are both controlled by the output of a further AND gate 73 which combines the signals STR, SCS, and the inverses of SCON and TCP.

The output of the AND gate 71 is a signal CGS which is applied to the enable input of a decoder 74. This decodes the loop number code supplied by bits C3–C7 of the control loop 13, to produce a signal on one of 32 outputs. This enables one of 32 OR gates 75, to produce one of 32 loop select signals SL0–SL31. The output of the AND gate 64 is a signal CGR which is applied to all the OR gates 75, so as to produce all the loop select signals SL0–SL31 simultaneously.

The signals SL0–SL31 are applied to a set of 32 NOR gates 76, along with the SELF TEST signal from the decoder 70. The outputs of these NOR gates provide the control signals DC1 for the respective user loops. The control signals DC2 for the user loops are supplied by the bit COM2 of the command register. (Thus, it should be noted that each user loop receives a separate DC1 signal, but they all receive the same DC2 signal).

The operation of the chip in each of the six command states can now be described.

RUN (command 010). In this state, both CGS and CGR are false, and so the loop select signals SL0-SL31 are all false. Thus, the outputs of the NOR gates 76 are all true. Also, COM2=0. Thus, it can be seen that, for each user loop, DC1=1 and DC2=0; that is, each user loop is put into the USER mode. This is the normal operating state of the chip.

HOLD (command 011). In this state, both CGS and CGR are false, and COM2=1, so that DC1=DC2=1 for each user loop. Thus, all the user loops are put into the HOLD mode.

SHIFT (command 001). If SCS is true, SCON false, and TCP false, the AND gate 73 will be enabled at each TR pulse. Thus, if the chip is selected and the control loop not selected, the signal CGS will be produced at each TR pulse, other than the one which produces TCP. When CGS is true, it enables the decoder 74, so as to produce one of the loop select signals SL0-31 according to the value of the loop number C3–C7. This puts the selected loop into the SHIFT mode with DC1=0 and DC2=1. When the TR pulse is not present, the select loop reverts to the HOLD mode, with DC1=DC2=1. All the other, non-selected loops remain in the HOLD mode. Thus, it can be seen that the selected user loop is shifted by one place at each TR pulse.

RESET (command 101). This is similar to the SHIFT state, except that, in this case, CGR rather than CGS is produced at each TR pulse. Thus, all the loops are put into the SHIFT mode at each TR pulse. This allows a constant value (e.g. zero) to be shifted into all the loops in parallel from the loop input path LOOPIN, so as to reset them.

RUN N BEATS (command 110). This has a similar effect to the RUN state, except that in this state the counter 64 (FIG. 6) is activated and counts a preset number N. When the counter finishes counting, it causes the control signal B to be produced. This loads the hardwired command 011 into the command register 60, thereby putting the chip into the HOLD state. This provides a useful facility for diagnostic testing of the chip.

SELF TEST (command 000). In this state, the SELF TEST signal from the decoder 70 forces the outputs of all the NOR gates 76 to zero. Thus, all the user loops are put into the test mode, with DC1=DC2=0. Each loop therefore adopts one of the four test sub-modes, according to the values of the test control bits TC1,TC2 for that particular loop. These bits will have been preset at suitable values, by loading the test bit control cells T1,T2 using the SHIFT state. For example, if it is desired to test a particular block of logic on the chip, those loops which act as inputs to the logic block would be put into their TEST GENERATE sub-modes to generate test patterns for that logic. Those loops which receive outputs from the logic block would be put into their TEST ANALYSE sub-modes, so as to form digital signatures from those outputs. Other loops may be put into the TEST HOLD sub-mode.

Figure 8:
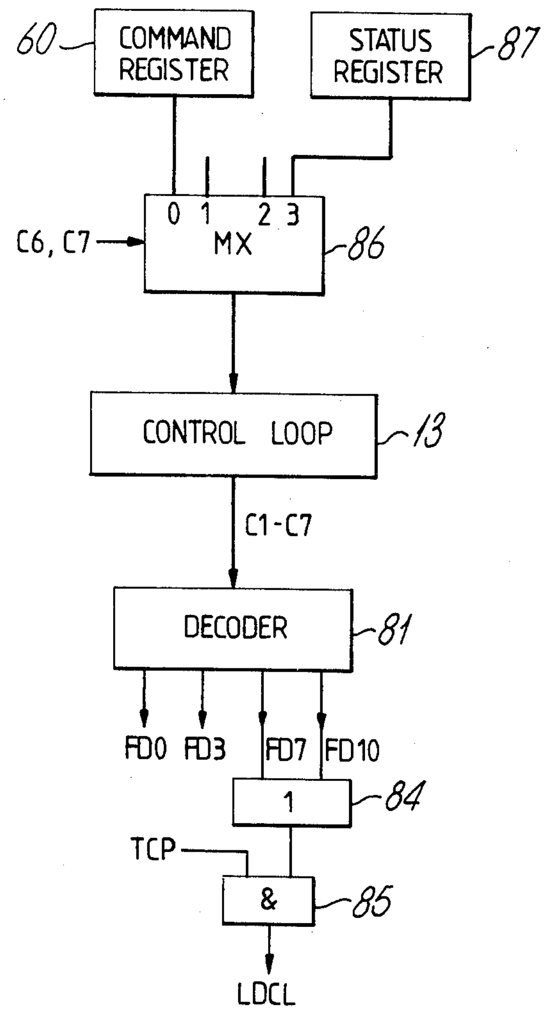

Referring now to FIG. 8, this again shows the control loop 13. As described above, the diagnostic controller can load a control function into the control loop by first raising the signals CS and CON and then producing a series of eight TR pulses. The CON signal is then removed and one further TR pulse produced, and this generates the transfer control pulse TCP. This activates the control function as will now be described.

Bits C1–C7 of the control loop are decoded in a decoder 81 to produce one of eleven function signals FD0–FD10 representing eleven possible control functions. Of these, only four, FD0,3,7 and 10, will be described herein; description of the other functions is not necessary for an understanding of the invention. The bit patterns which produce these four function signals are as follows:

| Function | C1 | C2 | C3 | C4 | C5 | C6 | C7 |
|---|---|---|---|---|---|---|---|
| FDO | 0 | — | — | — | — | — | — |
| FD3 | 1 | 1 | 0 | — | — | — | — |
| FD7 | 1 | 1 | 1 | 1 | 1 | 0 | 0 |
| FD10 | 1 | 1 | 1 | 1 | 1 | 1 | 1 |

As described above FD0 is combined in the AND gate 65 (FIG. 6) with the transfer control pulse TCP to produce the control signal A for the selection circuit 61 (FIG. 6). This causes the hardwired code 001 to be loaded into the command register 60, so as to set the chip into the SHIFT state. In this state, bits C3–C7 of the control loop are used as a loop number code, to select the loop it is desired to shift, as described above.

FD3 is combined in the AND gate 66 with TCP to produce the control signal C for the selection circuit 61. This causes bits C5–C7 of the control loop to be loaded into the command register 60. Thus, the FD3 function can be used to set the chip into any desired state, as specified by the bits C5–C7.

FD7 and FD10 are combined in an OR gate 84, the output of which is combined with TCP in an AND gate 85 to produce a signal LDCL. This causes the control loop 13 to be loaded in parallel from a 4:1 multiplexer 86, controlled by bits C6 and C7 of the control loop. In the case of the FD7 function, both C6 and C7 are zero and hence the multiplexer selects input 0. This is connected to the output of the command register 60. In the case of the FD10 function, C6=C7=1 and hence the multiplexer 86 selects input 3. This is connected to the output of a 5-bit status register 87 which holds information about the current operational status of the chip. The other two inputs to the multiplexer 76 are not relevant to the present invention.

Thus, it can be seen that the FD7 function causes the control loop 13 to be loaded with the current contents of the command register: these are placed into bits C5–C7, overwriting the previous contents. The contents of the control loop can then be shifted out serially over the loop output line LOOPOUT to the diagnostic controller. This function provides a convenient way for the diagnostic controller to read out the contents of the command register to ensure that it is operating correctly.

Similarly, the FD10 function causes the status register 87 to be loaded into the control loop: it is put into bits C3–C7 overwriting the existing contents. This provides a convenient way of examining the status of the chip.

We claim:

1. A digital integrated circuit comprising (a) at least one group of latches, (b) a serial input terminal and a serial output terminal connected to the latches, (c) means for producing a clock signal, (d) means for operating the group of latches in a user mode in which the group acts as at least one register with parallel inputs and outputs, (e) means for operating the group of latches in a hold mode in which the contents of all the latches in the group are preserved, (f) means for operating the groups of latches in a shift mode in which the latches are coupled together to form a serial shift path extending between the serial input terminal and the serial output terminal and data is stepped through this path by means of the clock signal, (g) a control input terminal for receiving a series of transfer pulses, and (h) a control circuit connected to the control input terminal and operable to put the group of latches into its hold mode and then, in response to each of the transfer pulses, to switch the group from the hold mode into the shift mode and then back into the hold mode.

2. An integrated circuit according to claim 1 wherein the circuit comprises a plurality of groups of latches, each of which is independently operable in any one of the modes specified in claim 1.

3. An integrated circuit according to claim 2 including means responsive to a SHIFT command to put all the groups into the hold mode and then, in response to each of said transfer pulses, to put a selected one of said groups into its shift mode for one clock beat.

4. An integrated circuit according to claim 2 indluding means responsive to a RESET command to put all the groups into the hold mode and then, in response to each of said transfer pulses, to put all the groups into the shift mode for one clock beat.

5. An integrated circuit according to claim 1 including means for storing a plurality of control bits, means responsive to a first value of the control bits for putting the group of latches into the hold mode, means responsive to a second value of the control bits for putting the group of latches into the shift mode, and means for inverting the value of a predetermined one of said control bits during each transfer pulse, thereby switching the group of latches from the hold mode to the shift mode.

6. An integrated circuit according to claim 1 including means for operating the group of latches in a self-test mode of operation in which it is operable as a feedback shift register.

7. An integrated circuit according to claim 1 in combination with a diagnostic controller which produces said transfer pulses and is connected to the serial input and output terminals of the circuit.

* * * * *